(12) United States Patent
Chiang et al.

(10) Patent No.: US 12,396,176 B2
(45) Date of Patent: Aug. 19, 2025

(54) 3T MEMORY WITH ENHANCED SPEED OF OPERATION AND DATA RETENTION

(71) Applicant: Taiwan Semiconductor Manufacturing Company, Ltd., Hsinchu (TW)

(72) Inventors: Hung-Li Chiang, Taipei (TW); Jer-Fu Wang, Taipei (TW); Tzu-Chiang Chen, Hsinchu (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 242 days.

(21) Appl. No.: 17/827,140

(22) Filed: May 27, 2022

(65) Prior Publication Data

US 2023/0240078 A1 Jul. 27, 2023

Related U.S. Application Data

(60) Provisional application No. 63/302,355, filed on Jan. 24, 2022.

(51) Int. Cl.
*H01L 29/04* (2006.01)
*G11C 5/06* (2006.01)
(Continued)

(52) U.S. Cl.
CPC ............ *H10B 51/30* (2023.02); *G11C 5/063* (2013.01); *H10B 51/10* (2023.02);
(Continued)

(58) Field of Classification Search
CPC ........ H10B 51/30; H10B 51/10; H10B 12/01; G11C 5/063; G11C 11/405;
(Continued)

(56) References Cited

U.S. PATENT DOCUMENTS 5,986,958 A * 11/1999 Voogel .................. G11C 11/404
365/222
7,672,152 B1 * 3/2010 Kulkarni ................ G11C 29/50
365/154

(Continued)

FOREIGN PATENT DOCUMENTS

TW 202105386 A 2/2021

*Primary Examiner* — Sheikh Maruf
(74) *Attorney, Agent, or Firm* — Merchant & Gould P.C

(57) ABSTRACT

A memory device including a plurality of memory cells, at least one of the plurality of memory cells includes a first transistor, a second transistor, and a third transistor. The first transistor includes a first drain/source path and a first gate structure electrically coupled to a write word line. The second transistor includes a second drain/source path and a second gate structure electrically coupled to the first drain/source path of the first transistor. The third transistor includes a third drain/source path electrically coupled to the second drain/source path of the second transistor and a third gate structure electrically coupled to a read word line. Where, the first transistor, and/or the second transistor, and/or the third transistor is a ferroelectric field effect transistor or a negative capacitance field effect transistor.

20 Claims, 12 Drawing Sheets

(51) Int. Cl.
*H10B 51/10* (2023.01)
*H10B 51/30* (2023.01)
*H10D 30/01* (2025.01)
*H10D 30/62* (2025.01)
*H10D 30/69* (2025.01)
*H10D 64/00* (2025.01)
*H10D 64/01* (2025.01)
*H10D 64/68* (2025.01)
*H10B 12/00* (2023.01)

(52) U.S. Cl.
CPC ....... *H10D 30/024* (2025.01); *H10D 30/0415* (2025.01); *H10D 30/6211* (2025.01); *H10D 30/701* (2025.01); *H10D 64/033* (2025.01); *H10D 64/689* (2025.01); *H10B 12/01* (2023.02)

(58) Field of Classification Search
CPC ............. H01L 29/40111; H01L 29/516; H01L 29/66795; H01L 29/6684; H01L 29/78391; H01L 29/7851; H01L 29/785
USPC ......................................................... 257/295
See application file for complete search history.

(56) References Cited

U.S. PATENT DOCUMENTS

| | | | | |
|---|---|---|---|---|
| 8,289,755 | B1* | 10/2012 | Rahim | G11C 11/4125 365/189.08 |
| 8,514,613 | B1* | 8/2013 | Lewis | G11C 11/418 365/207 |
| 8,797,790 | B1* | 8/2014 | Rahim | G11C 11/4125 365/156 |
| 8,907,392 | B2* | 12/2014 | Yamazaki | H10B 12/033 438/242 |
| 11,631,447 | B2 | 4/2023 | You et al. | |
| 2003/0095448 | A1* | 5/2003 | Ichige | G11C 16/0433 257/E27.103 |
| 2006/0017482 | A1* | 1/2006 | Chauhan | H03K 3/3565 327/205 |
| 2008/0005416 | A1* | 1/2008 | Telecco | G06F 13/28 710/62 |
| 2009/0173978 | A1* | 7/2009 | Kato | G11C 11/22 257/E29.264 |
| 2009/0207644 | A1* | 8/2009 | Paul | G11C 17/12 365/94 |
| 2011/0049592 | A1* | 3/2011 | Yoon | H10D 64/033 257/295 |
| 2011/0316059 | A1* | 12/2011 | Ahn | H10D 30/701 257/295 |
| 2012/0033478 | A1* | 2/2012 | Kang | H10D 64/033 257/295 |
| 2012/0230130 | A1* | 9/2012 | Sheppard | G11C 11/418 365/189.011 |
| 2013/0314977 | A1* | 11/2013 | Wang | G11C 11/412 365/156 |
| 2014/0138753 | A1* | 5/2014 | Ramaswamy | H10D 64/033 257/295 |
| 2015/0070964 | A1* | 3/2015 | Yamada | H10D 30/701 257/295 |
| 2015/0311349 | A1* | 10/2015 | Ramaswamy | H10D 30/024 257/295 |
| 2016/0005749 | A1* | 1/2016 | Li | H10D 30/0415 257/295 |
| 2016/0111549 | A1* | 4/2016 | Baars | H10D 84/0144 257/295 |
| 2016/0225795 | A1* | 8/2016 | Koezuka | H01L 27/1225 |
| 2016/0260721 | A1* | 9/2016 | Bowen | H10B 10/18 |
| 2018/0130509 | A1* | 5/2018 | Kulkarni | G11C 8/10 |
| 2018/0151746 | A1* | 5/2018 | Tu | H01L 29/513 |
| 2019/0088760 | A1* | 3/2019 | Lee | H01L 29/16 |
| 2019/0237139 | A1* | 8/2019 | McCollum | G11C 29/52 |
| 2021/0012833 | A1 | 1/2021 | Li et al. | |
| 2021/0028178 | A1* | 1/2021 | You | H01L 21/823821 |
| 2021/0408223 | A1* | 12/2021 | Chia | H01L 28/56 |
| 2022/0173250 | A1* | 6/2022 | Chiang | H10D 30/701 |

* cited by examiner

| | Write | Read | Hold |
|---|---|---|---|
| WWL | -VDD | -VDD | GND |
| WBL | -$V_{write}$ | -$V_{read-G}$ | -Vread |
| VDD | -VDD | -VDD | -VDD |
| RWL | GND | -VDD | VSS |
| RBL | -VSS | VSS | -VDD |

| | Write | Read | Hold |
|---|---|---|---|
| WWL | -VDD | VSS | GND |
| WBL | -V$_{write}$ | V$_{read-G}$ | GND |
| VDD | GND | GND | GND |
| RWL | GND | +VDD | VSS |
| RBL | GND | +VDD | GND |

|  | Write | Read | Hold |
|---|---|---|---|
| WWL | VDD | VDD | GND |
| WBL | $-V_{write}$ | $-V_{read-G}$ | $-V_{read}$ |
| VDD | -VDD | -VDD | -VDD |
| RWL | GND | -VDD | VSS |
| RBL | -VSS | VSS | -VDD |

| | Write | Read | Hold |
|---|---|---|---|
| WWL | VDD | VDD | GND |
| WBL | -V$_{write}$ | V$_{read-G}$ | -GND |
| VDD | GND | GND | GND |
| RWL | GND | +VDD | VSS |
| RBL | GND | +VDD | GND |

# 3T MEMORY WITH ENHANCED SPEED OF OPERATION AND DATA RETENTION

CROSS-REFERENCE TO RELATED APPLICATIONS

Memory This application claims the benefit of U.S. Provisional Application No. 63/302,355, filed Jan. 24, 2022, and titled "3T MEMORY WITH ENHANCED SPEED OF OPERATION AND DATA RETENTION," the disclosure of which is hereby incorporated herein by reference.

BACKGROUND

Memory devices, such as dynamic random-access memory (DRAM) devices, are used in a variety of applications. Example applications include, but are not limited to, computing devices, routers, and peripheral devices such as displays and printers. DRAM devices are often used in applications where low-cost and high-capacity memory is needed. One type of DRAM, referred to as a three transistor (3T) DRAM, has data written to a gate node of a storage transistor MS through a write transistor MW, and read out through a read transistor MR.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
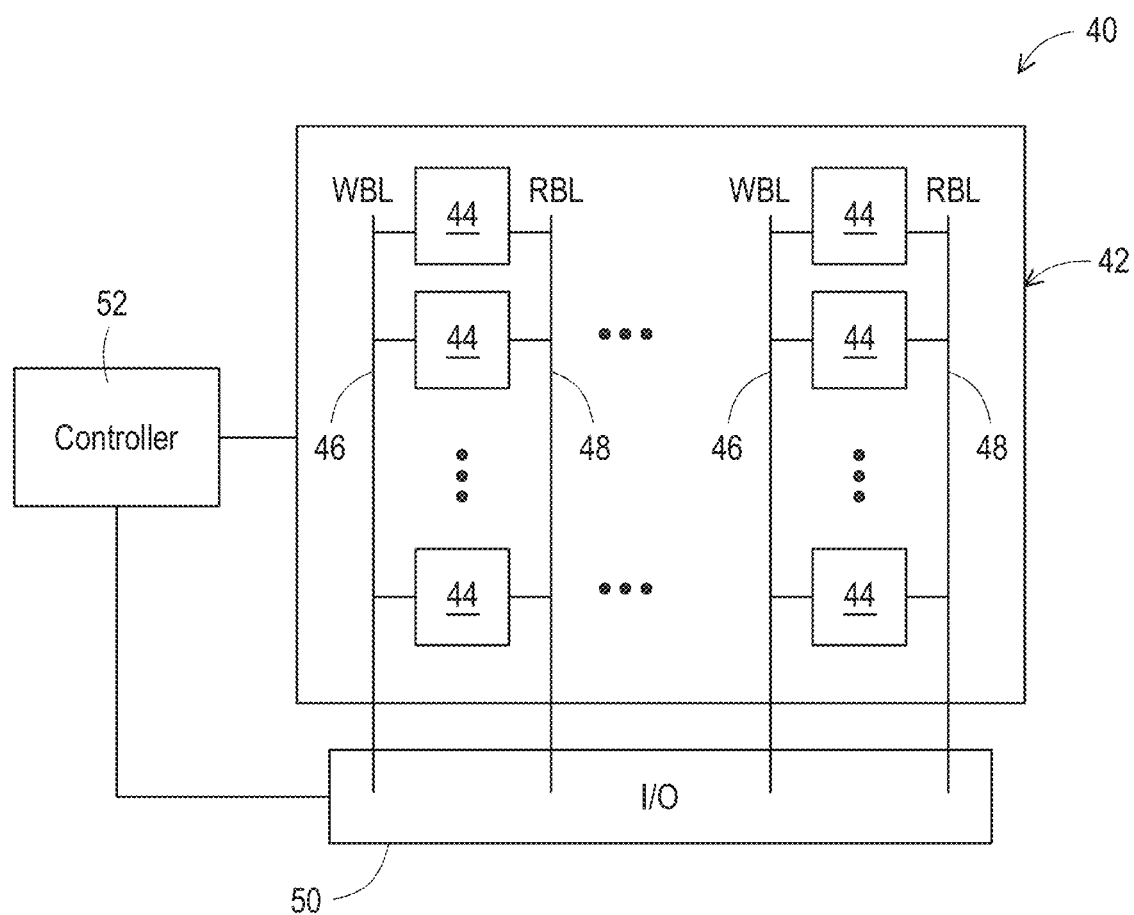
FIG. 1 is a block diagram schematically illustrating a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventionally, in a 3T DRAM, each of the storage transistor MS, the write transistor MW, and the read transistor MR is a metal-oxide semiconductor field-effect transistor (MOSFET) having a non-ferroelectric gate oxide. In a MOSFET, the switching speed of the transistor is limited by the subthreshold swing of the transistor. In some transistors, the subthreshold swing is about 60 millivolts (mV) per decade, i.e., 60 mV per each ten-fold increase in the drain current of the transistor. Decreasing the subthreshold swing of a transistor increases the switching speed of the transistor. Also, as to data retention times, lower gate capacitance of the storage transistor MS leads to shorter data retention times and increasing the gate capacitance of the storage transistor MS increases gate leakage that leads to shorter data retention times. Thus, the switching speeds of the MOSFETs having a non-ferroelectric gate oxide are limited and the data retention times are shorter, where stored data may be gradually lost through leakage paths.

Embodiments of the disclosure are directed to 3T DRAM cells that include transistors that provide increased data retention times and increased switching speeds, which result in decreased write times and decreased read times. In disclosed embodiments, one or more of the write transistor MW, the storage transistor MS, and the read transistor MR includes a ferroelectric material in the gate structure of the transistor. The ferroelectric material is manufactured to provide a selectable permanent polarization or to provide a negative gate capacitance, depending on the crystalline phase and/or stress state of the ferroelectric material. The ferroelectric material that provides the selectable permanent polarization can be used to store data and increase data retention times and the ferroelectric material that provides the negative gate capacitance can be used to amplify the electric field provided by the gate voltage to lower the subthreshold swing of the transistor and increase the switching speed of the transistor. A transistor that provides the selectable permanent polarization is referred to as a ferroelectric field effect transistor (FeFET), and a transistor that provides a negative gate capacitance is referred as a negative capacitance field effect transistor (NCFET).

In some embodiments, one or more of the write transistor MW and the read transistor MR is a FeFET and, in some embodiments, the storage transistor MS is an NCFET. In some embodiments, one or more of the write transistor MW and the read transistor MR is an NCFET and, in some embodiments, the storage transistor MS is a FeFET.

If the write transistor MW and/or the read transistor MR is an NCFET, the subthreshold swing of the transistor is reduced, and the switching speed of the transistor is increased. As a result, the write speed and/or the read speed of the 3T DRAM cell is increased. Also, if the storage transistor MS is a FeFET, data retention times are increased due to remnant polarization and, in some embodiments, data can be stored permanently, such that the memory becomes a nonvolatile memory and data retention times are no longer an issue.

FIG. 1 is a block diagram schematically illustrating a memory device 40, in accordance with some embodiments. The memory device 40 includes a memory array 42 that includes a plurality of memory cells 44 arranged in rows and columns. Each of the rows has a corresponding write word line WWL (not shown in FIG. 1) and a corresponding read word line RWL (not shown in FIG. 1). Also, each of the columns has a corresponding write bit line WBL 46 and a corresponding read bit line RBL 48. Each memory cell 44 of the plurality of memory cells 44 is electrically coupled to the write word line WWL and the read word line RWL of the row of the memory cell 44 and to the corresponding write bit line WBL 46 and read bit line RBL 48 of the column of the memory cell 44. The write bit line WBL 46 and the read bit line RBL 48 are electrically connected to an input/output (I/O) block 50 that is configured to provide data signals to and read data signals from the plurality of memory cells 44. In some embodiments, one or more memory cells of the plurality of memory cells 44 is a DRAM cell. In some embodiments, one or more memory cells of the plurality of memory cells 44 is a 3T DRAM cell. In some embodiments, one or more memory cells of the plurality of memory cells 44 is a 3T DRAM cell that includes at least one transistor that includes a ferroelectric material, such as hafnium zirconium oxide (HZO), in the gate structure of the transistor.

The memory device 40 includes a memory control circuit or controller 52 that is electrically connected to the memory array 42 and to the I/O block 50 and configured to control operation of the memory device 40. The controller 52 receives signals such as clock signals, command signals, and address signals for accessing and controlling operation of the memory device 40, including operation of the plurality of memory cells 44 in the memory array 42. For example, address signals are received and decoded into row and column addresses for accessing memory cells 44 of the memory array 42. Also, the controller 52 is configured to control the application of signals to the write word lines WWLs, the read word lines RWLs, the write bit lines WBLs 46, the read bit lines RBLs 48, the I/O block 50, and power supply lines of the memory cells 44 and the memory device 40.

In some embodiments, the controller 52 includes one or more processors. In some embodiments, the controller 52 includes one or more processors and memory configured to store code that is executed by the one or more processors to perform the functions of the memory device 40. In some embodiments, the controller 52 includes hardware, such as logic, configured to receive addresses and commands and perform the functions of the memory device 40. In some embodiments, the controller 52 includes hardware and/or firmware and/or software executed by the hardware for performing the functions of the memory device 40.

Figures 2, 3:
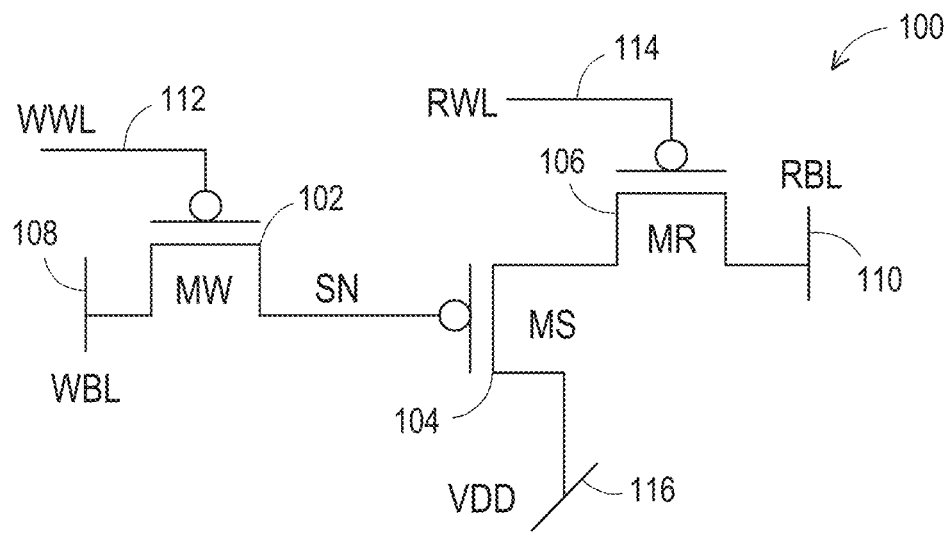
FIG. 2 is a diagram schematically illustrating a 3T DRAM cell, in accordance with some embodiments.
FIG. 3 is a diagram schematically illustrating a table that includes operating voltages for the 3T DRAM cell of FIG. 2, in accordance with some embodiments.

FIG. 2 is a diagram schematically illustrating a 3T DRAM cell 100, in accordance with some embodiments. The 3T DRAM cell 100 includes at least one transistor that includes a ferroelectric material, such as HZO, in the gate structure of the transistor. The 3T DRAM cell 100 is configured to be used in a memory device, such as the memory device 40 of FIG. 1. In some embodiments, the 3T DRAM cell 100 is like one of the memory cells 44.

The 3T DRAM cell 100 includes a write transistor MW 102, a storage transistor MS 104, and a read transistor MR 106. At least one of the write transistor MW 102, the storage transistor MS 104, and the read transistor MR 106 includes a ferroelectric material, such as HZO, in the gate structure of the transistor. The ferroelectric material is processed/manufactured to provide a selectable permanent polarization, i.e., a remnant polarization, or a negative gate capacitance, depending on the crystalline phase and/or stress state of the ferroelectric material. A transistor that includes the ferroelectric material that provides the selectable permanent polarization can be used to store data and increase the data retention times of the 3T DRAM cell 100. A transistor that includes the ferroelectric material that provides the negative gate capacitance can be used to amplify the electric field provided by the gate voltage, lower the subthreshold swing of the transistor, and increase the switching speed of the transistor. The transistor that provides the selectable permanent polarization is referred to as a FeFET, and the transistor that provides the negative gate capacitance is referred as an NCFET.

The 3T DRAM cell 100 is electrically connected to a write bit line WBL 108 and a read bit line RBL 110, like the write bit line WBL 46 and the read bit line RBL 48 of the memory device 40. Also, the 3T DRAM cell 100 is electrically connected to a write word line WWL 112, like the write word line WWL of the memory device 40, and a read word line RWL 114, like the read word line RWL of the memory device 40. In addition, the 3T DRAM cell 100 is electrically connected to receive a power supply voltage VDD 116.

The write transistor MW 102 has a drain/source path that extends from a first drain/source region that is electrically connected to the write bit line WBL 108 to a second drain/source region that is electrically connected to the gate structure of the storage transistor MS 104, also referred to as the storage node SN. The write word line WWL 112 is electrically connected to the gate structure of the write transistor MW 102.

The storage transistor MS 104 has a drain/source path that extends from a first drain/source region that is electrically connected to a first drain/source region of the read transistor MR 106 to a second drain/source region that is electrically connected to the power supply voltage VDD 116.

The read transistor MR 106 has a drain/source path that extends from the first drain/source region that is electrically connected to the first drain/source region of the storage transistor MS 104 to a second drain/source region that is electrically connected to the read bit line RBL 110. The read word line RWL 114 is electrically connected to the gate structure of the read transistor MR 106.

In operation, data is written to the storage transistor MS 104 through the write transistor MW 102 and data is read out from the storage transistor MS 104 through the read transistor MR 106.

In some embodiments, the write transistor MW 102 is formed to be an NCFET, the storage transistor MS 104 is formed to be a FeFET, and the read transistor MR 106 is formed to be a MOSFET with a high-k (HK) dielectric in the gate structure and without ferroelectric material in the gate structure. The NCFET write transistor MW has a lower subthreshold swing that increases the switching speed of the write transistor MW 102 and improves the write speed of the 3T DRAM cell 100. The FeFET storage transistor MS 104 has selectable permanent polarization, such that remnant polarization in the storage transistor MS 104 increases data retention times of the storage transistor MS 104 and the 3T DRAM cell 100. In other embodiments, the read transistor MR 106 can be formed to be an NCFET, such that the NCFET read transistor 106 has a lower subthreshold swing that increases the switching speed of the read transistor MR 106 and improves the read speed of the 3T DRAM cell 100.

Also, in other embodiments, the write transistor MW 102 can be formed to be a FeFET or a MOSFET with an HK dielectric in the gate structure and without ferroelectric material in the gate structure. In other embodiments, the storage transistor MS 104 can be formed to be an NCFET or a MOSFET with an HK dielectric in the gate structure and without ferroelectric material in the gate structure. Also, in other embodiments, the read transistor MR 106 can be formed to be a FeFET transistor.

FIG. 3 is a diagram schematically illustrating a table 140 that includes operating voltages for the 3T DRAM cell 100 of FIG. 2, in accordance with some embodiments. The table 140 includes voltages for writing data into the 3T DRAM cell 100 at 142, reading data from the 3T DRAM cell 100 at 144, and holding or maintaining the data in the 3T DRAM cell 100 at 146. The table 140 includes voltage for the write word line WWL 112 at 148, the write bit line WBL 108 at 150, the power supply voltage VDD 116 at 152, the read word line RWL 114 at 154, and the read bit line RBL 110 at 156.

In a write operation, to write data into the 3T DRAM cell 100, the write word line WWL 112 is set to −VDD to bias on the write transistor MW 102, and the write bit line WBL 108 is set to a write voltage −Vwrite to write the data onto the gate capacitance of the storage transistor MS 104. The power supply voltage VDD 116 is set to −VDD. Also, the read word line RWL 114 is set to GND to bias off the read transistor MR 106, and the read bit line RBL 110 is set to −VSS. In some embodiments, −VDD is −1.2 volts (V). In some embodiments, −Vwrite is −1.5 V for a low (logic 0) and 1.5 V for a high (logic 1). In some embodiments, GND is 0 V and, in some embodiments, −VSS is 0 V.

In a read operation, the write word line WWL 112 is set to −VDD, which biases on the write transistor MW 102, such that the write bit line WBL 108 receives the voltage −Vread-G from the gate of the storage transistor MS 104. The read bit line RBL 110 is charged to VSS and the read word line RWL 114 is set to −VDD to bias on the read transistor MR 106 for reading the state of the storage transistor MS 104 at the read bit line 110. If the storage transistor MS 104 is biased on, the read bit line RBL 110 is discharged toward −VDD, and if the storage transistor MS 104 is biased off, the read bit line remains charged to VSS. The power supply voltage VDD 116 is set to −VDD. In some embodiments, −VDD is −1.2 volts (V). In some embodiments, −Vread-G is −0.3 V. In some embodiments, VSS is 0 V.

In a hold operation, the write word line WWL 112 is set to GND to bias off the write transistor 102 and the write bit line WBL 108 is at −Vread. The read word line RWL 114 is set to VSS, which may bias off the read transistor MR 106 and the read bit line RBL 110 is set to −VDD. Also, the power supply voltage VDD 116 is set to −VDD. In some embodiments, GND is 0 V. In some embodiments, −Vread is −0.5 V. In some embodiments, −VDD is −1.2 V. In some embodiments, VSS is 0.1 V.

Figure 4:
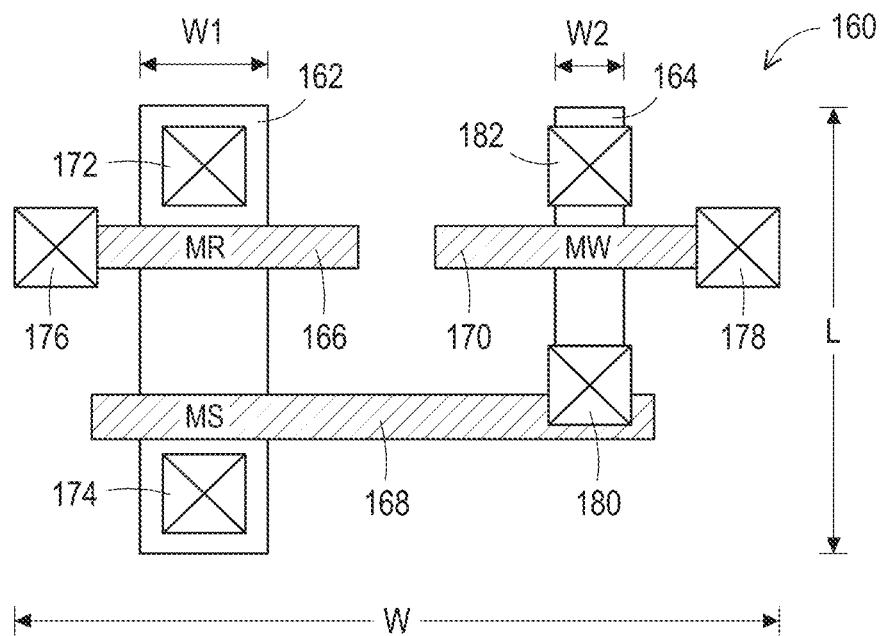
FIG. 4 is a diagram schematically illustrating a layout of the 3T DRAM cell of FIG. 2, in accordance with some embodiments.

FIG. 4 is a diagram schematically illustrating a layout 160 of the 3T DRAM cell 100 of FIG. 2, in accordance with some embodiments. The layout 160 has a cell width W and a cell length L. In some embodiments, the cell width W is 8 diffusion pitches, and, in some embodiments, the cell length L is 2 poly pitches.

The layout 160 includes a first oxide diffusion (OD) 162 disposed in a first direction and a second OD 164 disposed in the first direction and spaced apart from the first OD 162 in a second direction. In some embodiments, the first direction is perpendicular to the second direction.

The first OD 162 has a first oxide diffusion width W1, and the second OD 164 has a second oxide diffusion width W2. In some embodiments, the first oxide diffusion width W1 is greater than the second oxide diffusion width W2. In some embodiments, the first oxide diffusion width W1 is less than the second oxide diffusion width W2. In some embodiments, the first OD 162 includes multiple fin structures. In some embodiments, the second OD 164 includes multiple fin structures.

A first gate structure 166 of the read transistor MR 106 is disposed across the first OD 162 in the second direction and a second gate structure 168 of the storage transistor MS 104 is disposed across the first OD 162 in the second direction and spaced apart from the first gate structure 166 in the first direction. A third gate structure 170 of the write transistor MW 102 is disposed across the second OD 164 in the second direction.

A first drain/source region of the read transistor MR 106 is electrically connected to the read bit line RBL 110 through via 172 and the second drain/source region of the read transistor MR 106 is shared with a first drain/source region of the storage transistor MS 104. The second drain/source region of the storage transistor 104 is electrically connect to the power supply voltage VDD 116 through via 174.

The first gate structure 166 of the read transistor MR 106 is electrically connected to the read word line 114 through via 176 and the third gate structure 170 of the write transistor MW 102 is electrically connected to the write word line 112 through via 178. The second gate structure 168 of the storage transistor MS 104 is electrically connected to a first drain/source region of the write transistor MW 102 through via 180, and the second drain/source region of the write transistor MW 102 is electrically connected to the write bit line 108 through via 182.

FIGS. 5-13 are diagrams schematically illustrating an example of aspects of the manufacturing of embodiments of the disclosure. As described herein, the transistors that include ferroelectric material in their gate structures are either FeFETs or NCFETs, and the transistors that include HK dielectrics/oxides and not ferroelectric material in their gate structures are non-ferroelectric MOSFETs.

In manufacturing the gate structure of a FeFET or an NCFET, the ferroelectric material, such as HZO, is disposed across the ODs and the fins of the transistor and gate metal is disposed on the ferroelectric material. Due to differences in crystalline phase and/or stress state of the ferroelectric material, which is controlled by growth temperature and/or post plasma treatment during manufacturing, the ferroelectric material exhibits either a switchable/selectable permanent polarization or a negative capacitance characteristic. The ferroelectric material that exhibits the switchable/selectable permanent polarization is used to manufacture a FeFET and the ferroelectric material that exhibits the negative capacitance characteristic is used to manufacture an NCFET. In manufacturing a non-ferroelectric MOSFET, a HK dielectric/oxide is disposed across the OD and the fins of the transistor and the gate metal is disposed on the HK dielectric/oxide material.

Figure 5:
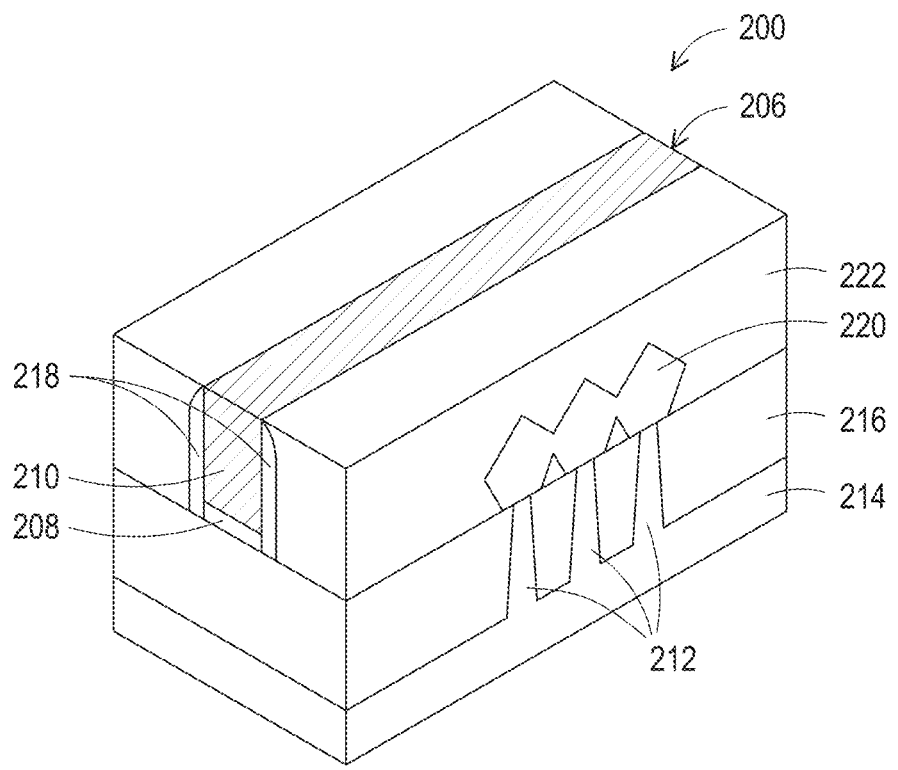
FIG. 5 is a diagram schematically illustrating the storage transistor MS, in accordance with some embodiments.
Figure 6:
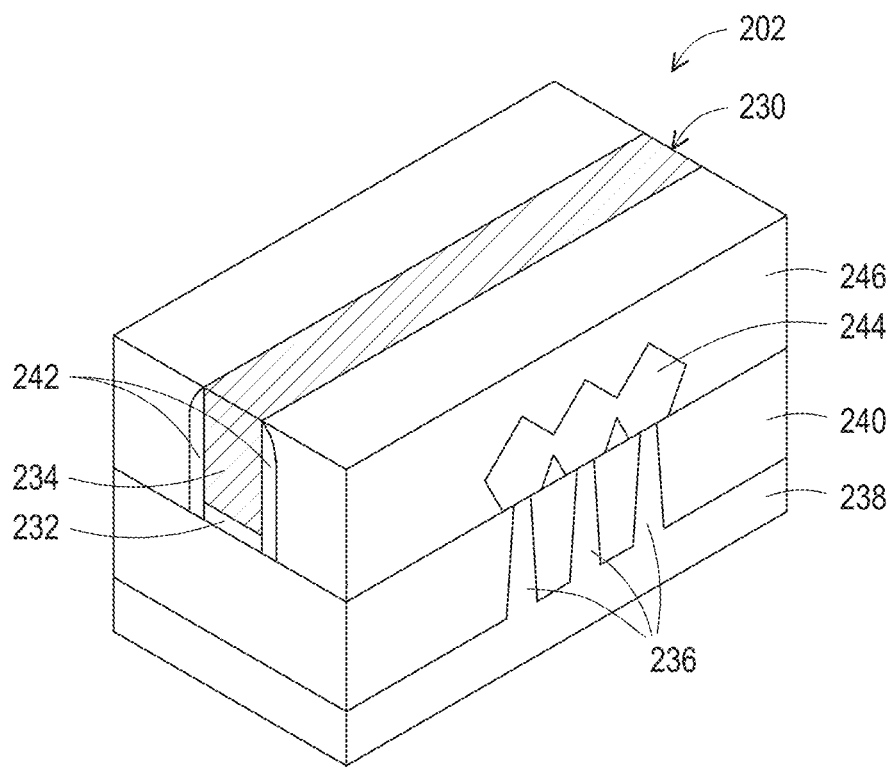
FIG. 6 is a diagram schematically illustrating the write transistor MW, in accordance with some embodiments.
Figure 7:
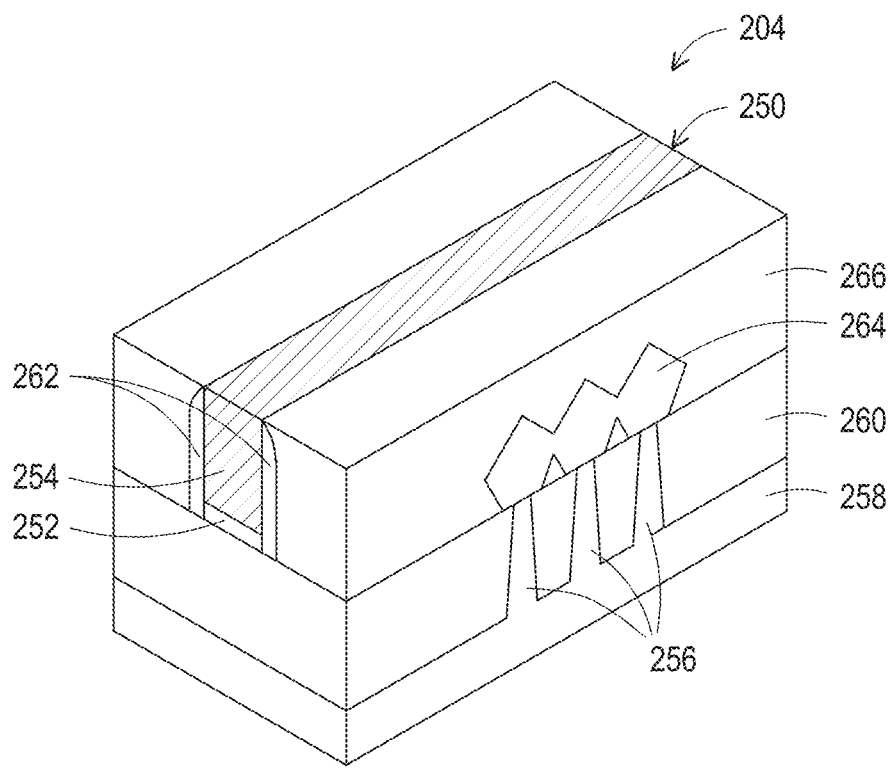
FIG. 7 is a diagram schematically illustrating the read transistor MR, in accordance with some embodiments.

FIGS. 5-7 are diagrams schematically illustrating a storage transistor MS 200 that is a FeFET, a write transistor MW 202 that is an NCFET, and a read transistor 204 that is a non-ferroelectric MOSFET including a HK dielectric/oxide and not ferroelectric material in the gate structure.

FIG. 5 is a diagram schematically illustrating the storage transistor MS 200, in accordance with some embodiments. The storage transistor MS 200 is a FeFET. The storage transistor MS 200 includes a gate structure 206 that includes a ferroelectric material Ferro 1 208 and a gate metal 210. The ferroelectric material Ferro 1 208 is manufactured/processed to exhibit the switchable/selectable permanent polarization characteristic of the ferroelectric material, which makes the storage transistor MS 200 a FeFET. In some embodiments, the storage transistor MS 200 is like the storage transistor MS 104 (shown in FIG. 2).

The storage transistor MS 200 includes fin structures 212 formed on or over a substrate 214. Shallow trench isolation regions 216 are formed on the substrate 214 and around the fin structures 212. In some embodiments, the fin structures 212 and the substrate 214 are formed from semiconductive material.

Next, in some embodiments, dummy gate patterning is used to manufacture a dummy gate over the fin structures 212 and the shallow trench isolation regions 216, and gate spacers 218 are formed on each side of the dummy gate. In some embodiments, the shallow trench isolation regions 216 include a dielectric material. In some embodiments, the gate spacers 218 include a dielectric material, such as an oxide material.

Drain/source epitaxial regions 220 are formed on the fin structures 212. In some embodiments, the drain/source epitaxial regions 220 are diamond shaped. In some embodiments, the drain/source epitaxial regions 220 include silicon germanium (SiGe).

Next, the dummy gate is removed and replaced with the metal gate structure 206. The ferroelectric material Ferro 1 208 is disposed on the fin structures 212, and the gate metal 210 is disposed on the ferroelectric material Ferro 1 208. In addition, an interlayer dielectric (ILD) 222 is formed on the shallow trench isolation regions 216 and the drain/source epitaxial regions 220, on each side of the gate spacers 218.

FIG. 6 is a diagram schematically illustrating the write transistor MW 202, in accordance with some embodiments. The write transistor MW 202 is an NCFET. The write transistor MW 202 includes a gate structure 230 that includes a ferroelectric material Ferro 2 232 and a gate metal 234. The ferroelectric material Ferro 2 232 is manufactured/processed to exhibit the negative capacitance characteristic of the ferroelectric material, which makes the write transistor MW 202 an NCFET. In some embodiments, the write transistor MW 202 is like the write transistor MW 102 (shown in FIG. 2).

The write transistor MW 202 includes fin structures 236 formed on a substrate 238. Shallow trench isolation regions 240 are formed on the substrate 238 and around the fin structures 236. In some embodiments, the fin structures 236 and the substrate 238 are formed from semiconductive material.

Next, in some embodiments, dummy gate patterning is used to manufacture a dummy gate over the fin structures 236 and the shallow trench isolation regions 240. Gate spacers 242 are formed on each side of the dummy gate. In some embodiments, the shallow trench isolation regions 240 include a dielectric material. In some embodiments, the gate spacers 242 include a dielectric material, such as an oxide material.

Drain/source epitaxial regions 244 are formed on the fin structures 236. In some embodiments, the drain/source epitaxial regions 244 are diamond shaped. In some embodiments, the drain/source epitaxial regions 244 include silicon germanium (SiGe).

Next, the dummy gate is removed and replaced with the metal gate structure 230. The ferroelectric material Ferro 2 232 is disposed on the fin structures 236, and the gate metal 234 is disposed on the ferroelectric material Ferro 2 232. In addition, an ILD 246 is formed on the shallow trench isolation regions 240 and the drain/source epitaxial regions 244, on each side of the gate spacers 242.

FIG. 7 is a diagram schematically illustrating the read transistor MR 204, in accordance with some embodiments. The read transistor MR 204 is a non-ferroelectric MOSFET including an HK dielectric/oxide and not ferroelectric material in the gate structure. The read transistor MR 204 includes a gate structure 250 that includes an HK dielectric/ oxide 252 and a gate metal 254. In some embodiments, the read transistor MR 204 is like the read transistor MR 106 (shown in FIG. 2).

The read transistor MR 204 includes fin structures 256 formed on a substrate 258. Shallow trench isolation regions 260 are formed on the substrate 258 and around the fin structures 256. In some embodiments, the fin structures 256 and the substrate 258 are formed from semiconductive material. In some embodiments, the shallow trench isolation regions 260 include a dielectric material.

Next, in some embodiments, dummy gate patterning is used to manufacture a dummy gate over the fin structures 256 and the shallow trench isolation regions 260. Gate spacers 262 are formed on each side of the dummy gate. In some embodiments, the gate spacers 262 include a dielectric material, such as silicon dioxide and/or silicon nitride.

Drain/source epitaxial regions 264 are formed on the fin structures 256. In some embodiments, the drain/source epitaxial regions 264 are diamond shaped. In some embodiments, the drain/source epitaxial regions 264 include silicon germanium (SiGe).

Next, the dummy gate is removed and replaced with the metal gate structure 250. The HK dielectric/oxide 252 is disposed on the fin structures 256, and the gate metal 254 is disposed on the HK dielectric/oxide 252. In addition, an ILD 266 is formed on the shallow trench isolation regions 260 and the drain/source epitaxial regions 264, on each side of the gate spacers 262.

FIGS. 8-13 are diagrams schematically illustrating a manufacturing process for manufacturing transistors such as the FeFET storage transistor MS 200, the NCFET write transistor MW 202, and the non-ferroelectric MOSFET read transistor 204. The manufacturing process is a gate-last, front-end-of-line (FEOL) manufacturing process. Also, the manufacturing process can be used to manufacture storage transistors MS that are NCFETs or non-ferroelectric MOSFETs, write transistors MW that are FeFETs or non-ferroelectric MOSFETs, and read transistors that are NCFETs or FeFETs.

Figure 8:
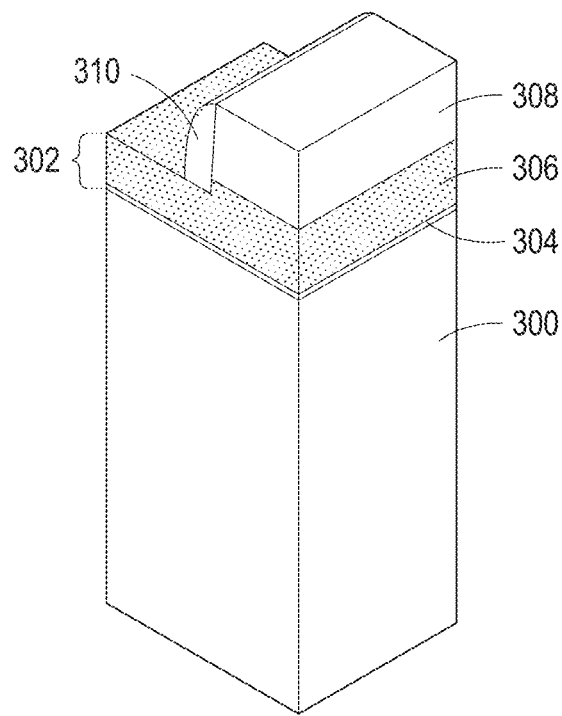
FIG. 8 is a diagram schematically illustrating a lithographic process for patterning a semiconductor substrate to manufacture a fin of a transistor, in accordance with some embodiments.

FIG. 8 is a diagram schematically illustrating a lithographic process for patterning a semiconductor substrate 300 to manufacture a fin of a transistor, in accordance with some embodiments. In some embodiments, the lithographic process is a self-aligned multiple patterning (SAMP) process. In some embodiments, the lithographic process is a self-aligned double patterning (SADP) process. In some embodiments, the lithographic process is a self-aligned quadruple patterning (SAQP) process.

A hard mask 302 is deposited on the semiconductor substrate 300. In some embodiments, the hard mask 302 includes a first layer 304 that includes one or more of silicon dioxide, silicon nitride, and amorphous carbon, deposited on the substrate 300, and a second layer 306 deposited on the first layer 304. In some embodiments, the first layer 304 is deposited by plasma enhanced chemical vapor deposition (PECVD). In some embodiments, the second layer 306 is deposited by low pressure chemical vapor deposition (LPCVD). In some embodiments, the second layer 306 includes one or more of polysilicon, silicon dioxide, silicon nitride, and amorphous carbon.

Next, a mandrel 308 is formed on the hard mask 302 and a spacer 310 is formed along the sides of the mandrel 308 and on the hard mask 302. In some embodiments, the mandrel 308 includes at least one of amorphous carbon, amorphous silicon, and polysilicon. In some embodiments, the spacer 310 includes silicon nitride and/or silicon dioxide deposited on the hard mask layer 302. In some embodiments, the mandrel 308 is prepared by PECVD. In some embodiments, the spacer 310 is prepared by plasma atomic layer deposition (ALD).

Figure 9:
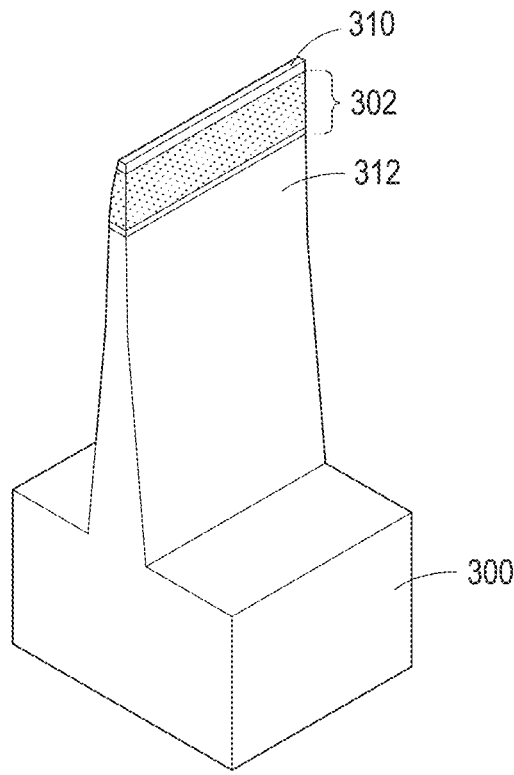
FIG. 9 is a diagram schematically illustrating a fin that is formed by etching away portions of the hard mask and the substrate, in accordance with some embodiments.

FIG. 9 is a diagram schematically illustrating a fin 312 that is formed by etching away portions of the hard mask 302 and the substrate 300, in accordance with some embodiments. Other portions of the hard mask 302 and the spacer 310 remain at the top of the fin 312 until being removed. In some embodiments, the fin 312 is formed in a highly anisotropic etching process. In some embodiments, the fin 312 is formed in a dry etching process. In some embodiments, the fin 312 is formed in a wet etching process. In some embodiments, the fin 312 is formed in an etching process that includes plasma etching. In some embodiments, the fin 312 is formed in an etching process that includes chemical etching.

Figure 10:
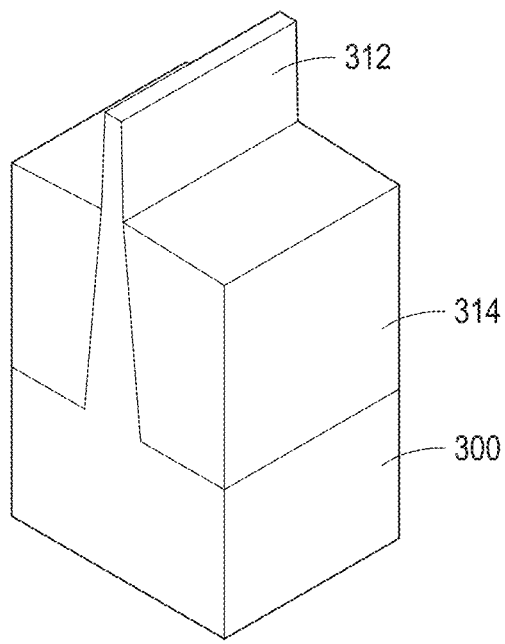
FIG. 10 is a diagram schematically illustrating shallow trench isolation (STI) material deposited on each side of the slanted portion of the fin, in accordance with some embodiments.

FIG. 10 is a diagram schematically illustrating shallow trench isolation (STI) material 314 deposited on each side of the slanted portion of the fin 312, in accordance with some embodiments. STI is used to isolate the fin 312 from other fins and active regions. In some embodiments, the STI material 314 includes silicon dioxide and/or silicon nitride. In some embodiments, the STI material 314 is prepared by a chemical vapor deposition (CVD) process.

Figure 11:
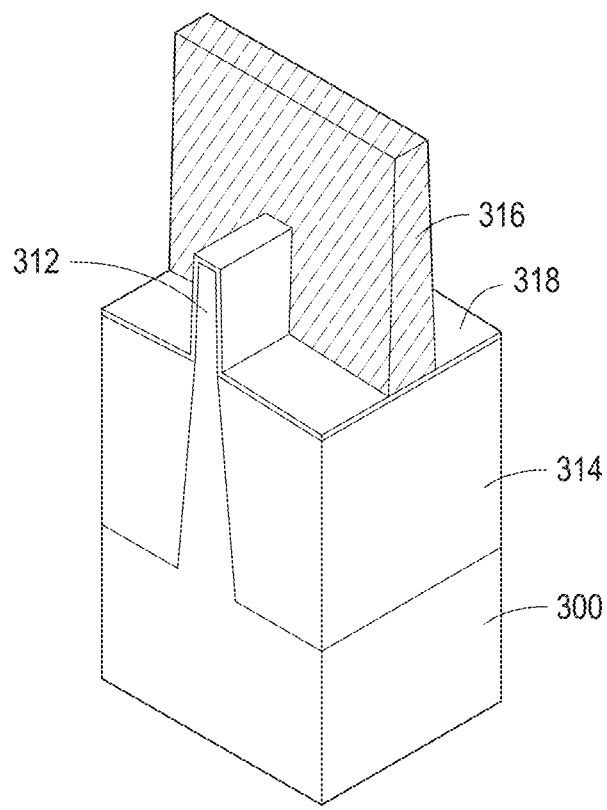
FIG. 11 is a diagram schematically illustrating a dummy gate disposed over the channel region of the fin and over the STI material, in accordance with some embodiments.

FIG. 11 is a diagram schematically illustrating a dummy gate 316 disposed over the channel region of the fin 312 and over the STI material 314, in accordance with some embodiments. In some embodiments, the dummy gate 316 includes polysilicon. In some embodiments, the dummy gate 316 includes amorphous silicon. In some embodiments, a thin dielectric layer 318 is deposited on the fin 312 and the STI material 314, under the dummy gate 316.

Figure 12:
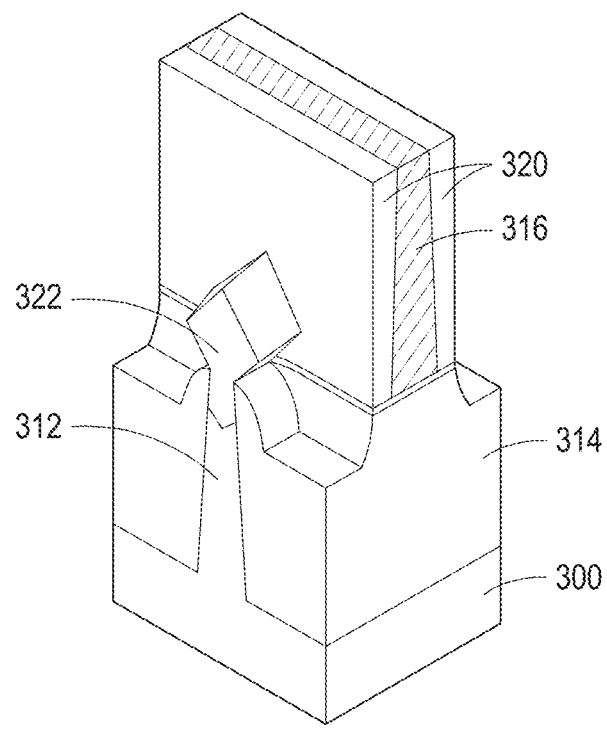
FIG. 12 is a diagram schematically illustrating gate spacers formed on each side of the dummy gate and drain/source epitaxial regions formed on the fin, in accordance with some embodiments.

FIG. 12 is a diagram schematically illustrating gate spacers 320 formed on each side of the dummy gate 316 and drain/source epitaxial regions 322 formed on the fin 312, in accordance with some embodiments. In some embodiments, the gate spacers 320 include a dielectric material, such as silicon dioxide and/or silicon nitride. In some embodiments, the drain/source epitaxial regions 322 are diamond shaped. In some embodiments, the drain/source epitaxial regions 322 include SiGe.

Figure 13:
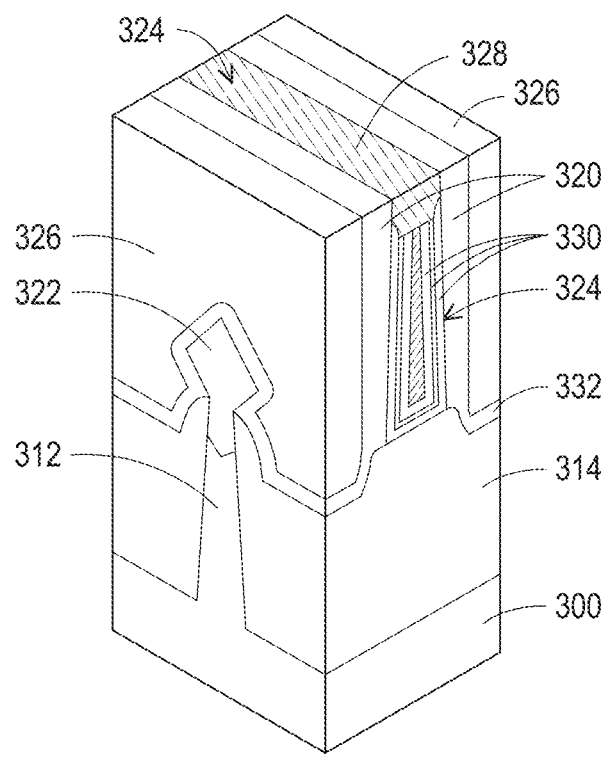
FIG. 13 is a diagram schematically illustrating a metal gate stack and ILD, in accordance with some embodiments.

FIG. 13 is a diagram schematically illustrating a metal gate stack 324 and ILD 326, in accordance with some embodiments. The dummy gate 316 has been removed and replaced with the metal gate stack 324. The ILD 326 has been formed adjacent the gate spacers 320 and over the drain/source epitaxial regions 322.

The metal gate stack 324 includes a contact metal region 328 and one or more metal/dielectric layers 330. In some embodiments, the metal/dielectric layers 330 include ferroelectric material, such as Ferro 1 and Ferro2 (shown in FIGS. 5 and 6) to make the transistor a FeFET or an NCFET. In some embodiments, the metal/dielectric layers 330 include HK dielectric/oxide to make the transistor a non-ferroelectric MOSFET.

In addition, the ILD 326 is formed over the STI material 314 and the drain/source epitaxial regions 322, on each side of the gate spacers 320. In some embodiments, a dielectric layer 332 is formed over the STI material 314 and the drain/source epitaxial regions 322 prior to depositing the ILD 326 on the dielectric layer 332. In some embodiments, the dielectric material 332 includes silicon dioxide and/or silicon nitride.

Figure 14:
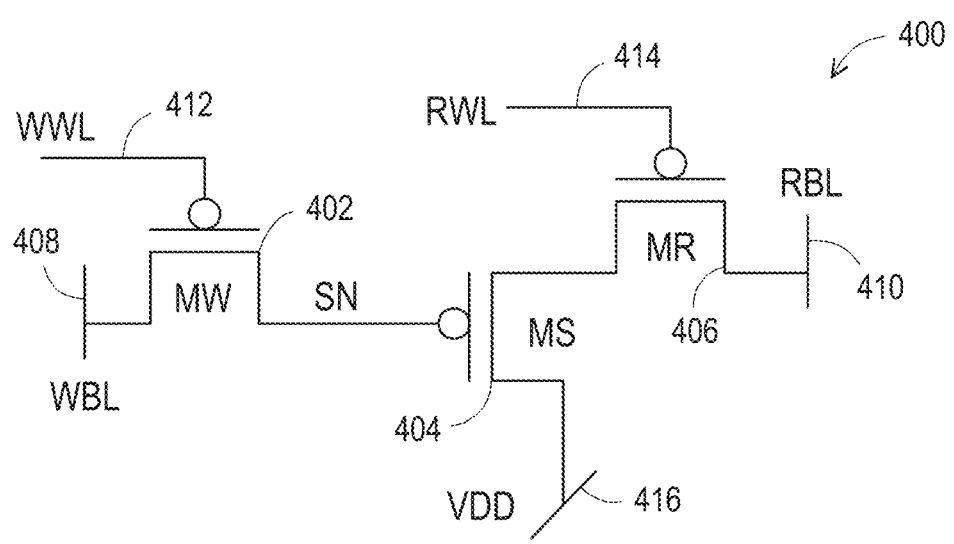
FIG. 14 is a diagram schematically illustrating a 3T DRAM cell that includes a write transistor MW that is an NCFET, a storage transistor MS that is a FeFET, and a read transistor MR that is an NCFET, in accordance with some embodiments.

FIG. 14 is a diagram schematically illustrating a 3T DRAM cell 400 that includes a write transistor MW 402 that is an NCFET, a storage transistor MS 404 that is a FeFET, and a read transistor MR 406 that is an NCFET, in accordance with some embodiments. The 3T DRAM cell 400 is configured to be used in a memory device, such as the memory device 40 of FIG. 1. In some embodiments, the 3T DRAM cell 400 is like one of the memory cells 44.

Each of the write transistor MW 402, the storage transistor MS 404, and the read transistor MR 406 includes a ferroelectric material in the gate structure of the transistor. The ferroelectric material is processed/manufactured to provide a selectable permanent polarization, i.e., a remnant polarization, or a negative gate capacitance, depending on the crystalline phase and/or stress state of the ferroelectric material. A transistor that includes the ferroelectric material that provides the selectable permanent polarization is a FeFET that can be used to store data and increase the data retention times of the 3T DRAM cell 400. A transistor that includes the ferroelectric material that provides the negative gate capacitance is an NCFET that can be used to amplify the electric field provided by the gate voltage, lower the subthreshold swing of the transistor, and increase the switching speed of the transistor. In some embodiments, at least one of the transistors 402, 404, and 406 includes HZO in the gate structure of the transistor.

The 3T DRAM cell 400 is electrically connected to a write bit line WBL 408 and a read bit line RBL 410, like the write bit line WBL 46 and the read bit line RBL 48 of the memory device 40. Also, the 3T DRAM cell 400 is electrically connected to a write word line WWL 412, like the write word line WWL of the memory device 40, and a read word line RWL 414, like the read word line RWL of the memory device 40. In addition, the 3T DRAM cell 400 is electrically connected to receive a power supply voltage VDD 416.

The write transistor MW 402 has a drain/source path that extends from a first drain/source region that is electrically connected to the write bit line WBL 408 to a second drain/source region that is electrically connected to the gate structure of the storage transistor MS 404, also referred to as the storage node SN. The write word line WWL 412 is electrically connected to the gate structure of the write transistor MW 402.

The storage transistor MS 404 has a drain/source path that extends from a first drain/source region that is electrically connected to a first drain/source region of the read transistor MR 406 to a second drain/source region that is electrically connected to the power supply voltage VDD 416.

The read transistor MR 406 has a drain/source path that extends from the first drain/source region that is electrically connected to the first drain/source region of the storage transistor MS 404 to a second drain/source region that is electrically connected to the read bit line RBL 410. The read word line RWL 414 is electrically connected to the gate structure of the read transistor MR 406.

In operation, data is written to the storage node SN of the storage transistor MS 404 through the write transistor MW 402 and data is read out from the storage transistor MS 404 through the read transistor MR 406.

The write transistor MW 402 is formed to be an NCFET, the storage transistor MS 404 is formed to be a FeFET, and the read transistor MR 406 is formed to be an NCFET. The write transistor MW 402 that is an NCFET has a lower subthreshold swing that increases the switching speed of the write transistor MW 402 and increases the write speed of the 3T DRAM cell 400. The storage transistor MS 404 that is a FeFET has selectable permanent polarization, such that remnant polarization in the storage transistor MS 404 increases data retention times of the storage transistor MS 404 and the 3T DRAM cell 400. The read transistor MR 406 that is an NCFET has a lower subthreshold swing that increases the switching speed of the read transistor MR 406 and improves or increases the read speed of the 3T DRAM cell 400.

Each of the 3T DRAM cell 100 and the 3T DRAM cell 400 includes three p-type FETs, such that the 3T DRAM cell 400 operates like the 3T DRAM cell 100 and the operating voltages in table 140 of FIG. 3 can be used to operate the 3T DRAM cell 400. Also, the layout 160 of FIG. 4 can be used to lay out the 3T DRAM cell 400, and the manufacturing steps of FIGS. 5-13 can be used to manufacture the 3T DRAM cell 400.

FIGS. 15-20 are diagrams schematically illustrating three 3T DRAM cells and their corresponding tables of operating voltages. Each of the three 3T DRAM cells includes different combinations of p-type and n-type FETs.

Figures 15, 16:
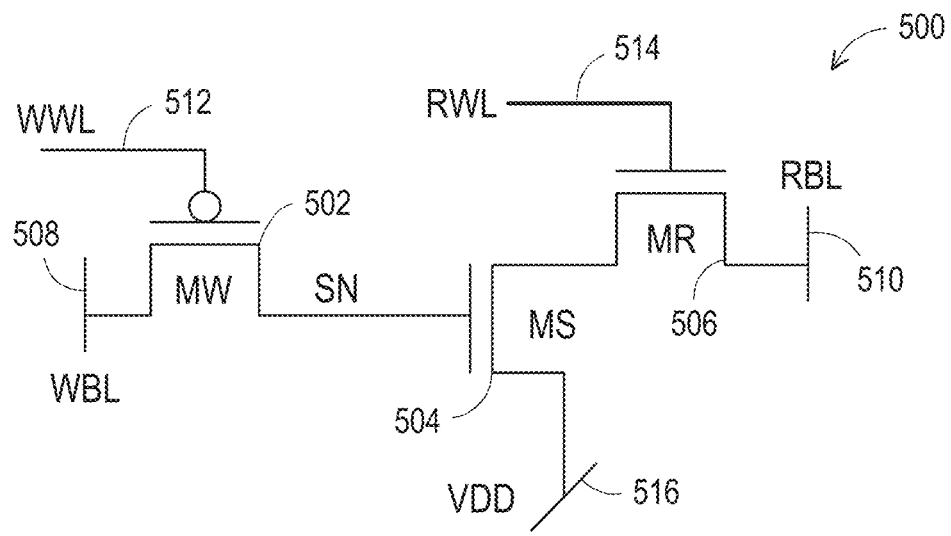
FIG. 15 is a diagram schematically illustrating a 3T DRAM cell that includes a write transistor MW that is a p-type FET, a storage transistor MS that is an n-type FET, and a read transistor MR that is an n-type FET, in accordance with some embodiments.
FIG. 16 is a diagram schematically illustrating a table that includes operating voltages for the 3T DRAM cell of FIG. 15, in accordance with some embodiments.

FIG. 15 is a diagram schematically illustrating a 3T DRAM cell 500 that includes a write transistor MW 502 that is a p-type FET, a storage transistor MS 504 that is an n-type FET, and a read transistor MR 506 that is an n-type FET, in accordance with some embodiments. The 3T DRAM cell 500 includes at least one transistor that includes a ferroelectric material, such as HZO, in the gate structure of the transistor. The 3T DRAM cell 500 is configured to be used in a memory device, such as the memory device 40 of FIG. 1. In some embodiments, the 3T DRAM cell 500 is like one of the memory cells 44.

At least one of the write transistor MW 502, the storage transistor MS 504, and the read transistor MR 506 includes a ferroelectric material, such as HZO, in the gate structure of the transistor. The ferroelectric material is processed/manufactured to provide a selectable permanent polarization, i.e., a remnant polarization, or a negative gate capacitance, depending on the crystalline phase and/or stress state of the ferroelectric material. A transistor that includes the ferroelectric material that provides the selectable permanent polarization is a FeFET that can be used to store data and increase the data retention times of the 3T DRAM cell 500. A transistor that includes the ferroelectric material that provides the negative gate capacitance characteristic is an NCFET that can be used to amplify the electric field provided by the gate voltage, lower the subthreshold swing of the transistor, and increase the switching speed of the transistor.

The 3T DRAM cell 500 is electrically connected to a write bit line WBL 508 and a read bit line RBL 510, like the write bit line WBL 46 and the read bit line RBL 48 of the memory device 40. Also, the 3T DRAM cell 500 is electrically connected to a write word line WWL 512, like the write word line WWL of the memory device 40, and a read word line RWL 514, like the read word line RWL of the memory device 40. In addition, the 3T DRAM cell 500 is electrically connected to receive a power supply voltage VDD 516.

The write transistor MW 502 has a drain/source path that extends from a first drain/source region that is electrically connected to the write bit line WBL 508 to a second drain/source region that is electrically connected to the gate structure of the storage transistor MS 504, also referred to as the storage node SN. The write word line WWL 512 is electrically connected to the gate structure of the write transistor MW 502.

The storage transistor MS 504 has a drain/source path that extends from a first drain/source region that is electrically connected to a first drain/source region of the read transistor MR 506 to a second drain/source region that is electrically connected to the power supply voltage VDD 516.

The read transistor MR 506 has a drain/source path that extends from the first drain/source region that is electrically connected to the first drain/source region of the storage transistor MS 504 to a second drain/source region that is electrically connected to the read bit line RBL 510. The read word line RWL 514 is electrically connected to the gate structure of the read transistor MR 506.

In operation, data is written to the storage node SN of the storage transistor MS 504 through the write transistor MW 502 and data is read out from the storage transistor MS 504 through the read transistor MR 506.

In some embodiments, the write transistor MW 502 is formed to be an NCFET, the storage transistor MS 504 is formed to be a FeFET, and the read transistor MR 506 is formed to be a MOSFET with a HK dielectric in the gate structure and without ferroelectric material in the gate structure. The NCFET write transistor MW 502 has a lower subthreshold swing that increases the switching speed of the write transistor MW 502 and improves the write speed of the 3T DRAM cell 500. The FeFET storage transistor MS 504 has selectable permanent polarization, such that remnant polarization in the storage transistor MS 504 increases data retention times of the storage transistor MS 504 and the 3T DRAM cell 500. In other embodiments, the read transistor MR 506 can be formed to be an NCFET, such that the NCFET read transistor 506 has a lower subthreshold swing that increases the switching speed of the read transistor MR 506 and improves the read speed of the 3T DRAM cell 500.

Also, in other embodiments, the write transistor MW 502 can be formed to be a FeFET or a MOSFET with a HK dielectric in the gate structure and without ferroelectric material in the gate structure. In other embodiments, the storage transistor MS 504 can be formed to be an NCFET or a MOSFET with a HK dielectric in the gate structure and without ferroelectric material in the gate structure. Also, in other embodiments, the read transistor MR 506 can be formed to be a FeFET transistor.

A layout that is like the layout 160 of FIG. 4 can be used to lay out the 3T DRAM cell 500, and the manufacturing steps of FIGS. 5-13 can be used to manufacture the 3T DRAM cell 500.

FIG. 16 is a diagram schematically illustrating a table 540 that includes operating voltages for the 3T DRAM cell 500 of FIG. 15, in accordance with some embodiments. The table 540 includes voltages for writing data into the 3T DRAM cell 500 at 542, reading data from the 3T DRAM cell 500 at 544, and holding or maintaining the data in the 3T DRAM cell 500 at 546. The table 540 includes voltage for the write word line WWL 512 at 548, the write bit line WBL 508 at 550, the power supply voltage VDD 516 at 552, the read word line RWL 514 at 554, and the read bit line RBL 510 at 556.

In a write operation, to write data into the 3T DRAM cell 500, the write word line WWL 512 is set to −VDD to bias on the write transistor MW 502, and the write bit line WBL 508 is set to a write voltage −Vwrite to write the data onto the gate capacitance at the storage node SN of the storage transistor MS 504. The power supply voltage VDD 516 is set to GND. Also, the read word line RWL 514 is set to GND to bias off the read transistor MR 506, and the read bit line RBL 510 is set to GND. In some embodiments, −VDD is −1.2 V. In some embodiments, −Vwrite is −1.5 V for a low (logic 0) and 1.5 V for a high (logic 1). In some embodiments, GND is 0 V.

In a read operation, the write word line WWL 512 is set to VSS, which may bias on the write transistor MW 502, such that the write bit line WBL 508 receives the voltage Vread-G from the gate of the storage transistor MS 504. The read bit line RBL 510 is charged to +VDD and the read word line RWL 514 is set to +VDD to bias on the read transistor MR 506 for reading the state of the storage transistor MS 504 at the read bit line 510. If the storage transistor MS 504 is biased on, the read bit line RBL 510 is discharged toward GND, and if the storage transistor MS 504 is biased off, the read bit line remains charged to +VDD. The power supply voltage VDD 516 is set to GND. In some embodiments, VSS is 0.1 V. In some embodiments, −Vread-G is −0.3 V. In some embodiments, GND is 0 and, in some embodiments +VDD is 1.2 V.

In a hold operation, the write word line WWL 512 is set to GND to bias off the write transistor 502 and the write bit line WBL 508 is set to GND. The read word line RWL 514 is set to VSS, which may bias off the read transistor MR 506 and the read bit line RBL 510 is set to GND. Also, the power supply voltage VDD 516 is set to GND. In some embodiments, GND is 0 V. In some embodiments, VSS is 0.1 V.

Figures 17, 18:
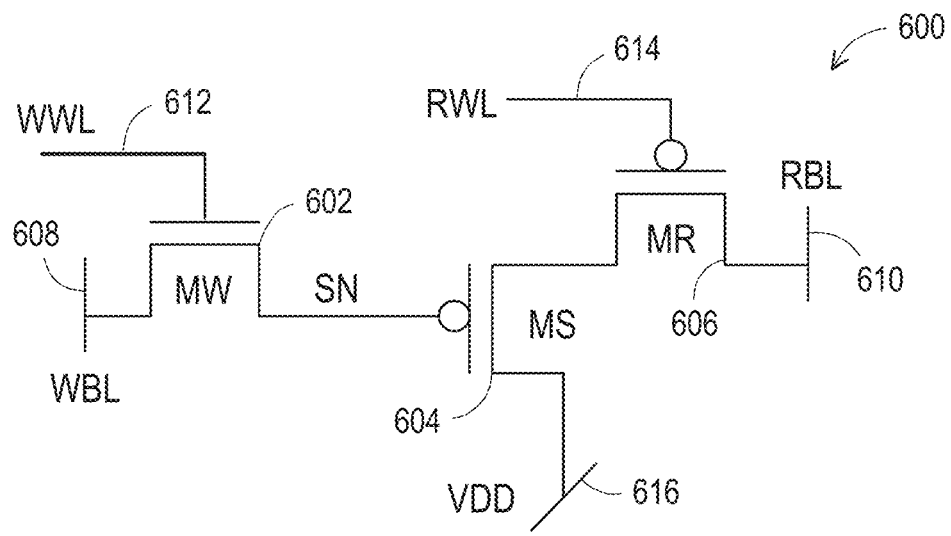
FIG. 17 is a diagram schematically illustrating a 3T DRAM cell that includes a write transistor MW that is an n-type FET, a storage transistor MS that is a p-type FET, and a read transistor MR that is a p-type FET, in accordance with some embodiments.
FIG. 18 is a diagram schematically illustrating a table that includes operating voltages for the 3T DRAM cell of FIG. 17, in accordance with some embodiments.

FIG. 17 is a diagram schematically illustrating a 3T DRAM cell 600 that includes a write transistor MW 602 that is an n-type FET, a storage transistor MS 604 that is a p-type FET, and a read transistor MR 606 that is a p-type FET, in accordance with some embodiments. The 3T DRAM cell 600 includes at least one transistor that includes a ferroelectric material, such as HZO, in the gate structure of the transistor. The 3T DRAM cell 600 is configured to be used in a memory device, such as the memory device 40 of FIG. 1. In some embodiments, the 3T DRAM cell 600 is like one of the memory cells 44.

At least one of the write transistor MW 602, the storage transistor MS 604, and the read transistor MR 606 includes a ferroelectric material, such as HZO, in the gate structure of the transistor. The ferroelectric material is processed/manufactured to provide a selectable permanent polarization, i.e., a remnant polarization, or a negative gate capacitance, depending on the crystalline phase and/or stress state of the ferroelectric material. A transistor that includes the ferroelectric material that provides the selectable permanent polarization is a FeFET that can be used to store data and increase the data retention times of the 3T DRAM cell 600. A transistor that includes the ferroelectric material that provides the negative gate capacitance characteristic is an NCFET that can be used to amplify the electric field provided by the gate voltage, lower the subthreshold swing of the transistor, and increase the switching speed of the transistor.

The 3T DRAM cell 600 is electrically connected to a write bit line WBL 608 and a read bit line RBL 610, like the write bit line WBL 46 and the read bit line RBL 48 of the memory device 40. Also, the 3T DRAM cell 600 is electrically connected to a write word line WWL 612, like the write word line WWL of the memory device 40, and a read word line RWL 614, like the read word line RWL of the memory device 40. In addition, the 3T DRAM cell 600 is electrically connected to receive a power supply voltage VDD 616.

The write transistor MW 602 has a drain/source path that extends from a first drain/source region that is electrically connected to the write bit line WBL 608 to a second drain/source region that is electrically connected to the gate structure of the storage transistor MS 604, also referred to as the storage node SN. The write word line WWL 612 is electrically connected to the gate structure of the write transistor MW 602.

The storage transistor MS 604 has a drain/source path that extends from a first drain/source region that is electrically connected to a first drain/source region of the read transistor MR 606 to a second drain/source region that is electrically connected to the power supply voltage VDD 616.

The read transistor MR 606 has a drain/source path that extends from the first drain/source region that is electrically connected to the first drain/source region of the storage transistor MS 604 to a second drain/source region that is electrically connected to the read bit line RBL 610. The read word line RWL 614 is electrically connected to the gate structure of the read transistor MR 606.

In operation, data is written to the storage node SN of the storage transistor MS 604 through the write transistor MW 602 and data is read out from the storage transistor MS 604 through the read transistor MR 606.

In some embodiments, the write transistor MW 602 is formed to be an NCFET, the storage transistor MS 604 is formed to be a FeFET, and the read transistor MR 606 is formed to be a MOSFET with an HK dielectric in the gate structure and without ferroelectric material in the gate structure. The NCFET write transistor MW 602 has a lower subthreshold swing that increases the switching speed of the write transistor MW 602 and improves the write speed of the 3T DRAM cell 600. The FeFET storage transistor MS 604 has selectable permanent polarization, such that remnant polarization in the storage transistor MS 604 increases data retention times of the storage transistor MS 604 and the 3T DRAM cell 600. In other embodiments, the read transistor MR 606 can be formed to be an NCFET, such that the NCFET read transistor 606 has a lower subthreshold swing that increases the switching speed of the read transistor MR 606 and improves the read speed of the 3T DRAM cell 600.

Also, in other embodiments, the write transistor MW 602 can be formed to be a FeFET or a MOSFET with a HK dielectric in the gate structure and without ferroelectric material in the gate structure. In other embodiments, the storage transistor MS 604 can be formed to be an NCFET or a MOSFET with a HK dielectric in the gate structure and without ferroelectric material in the gate structure. Also, in other embodiments, the read transistor MR 606 can be formed to be a FeFET transistor.

A layout that is like the layout 160 of FIG. 4 can be used to lay out the 3T DRAM cell 600, and the manufacturing steps of FIGS. 5-13 can be used to manufacture the 3T DRAM cell 600.

FIG. 18 is a diagram schematically illustrating a table 640 that includes operating voltages for the 3T DRAM cell 600 of FIG. 17, in accordance with some embodiments. The table 640 includes voltages for writing data into the 3T DRAM cell 600 at 642, reading data from the 3T DRAM cell 600 at 644, and holding or maintaining the data in the 3T DRAM cell 600 at 646. The table 640 includes voltage for the write word line WWL 612 at 648, the write bit line WBL 608 at 650, the power supply voltage VDD 616 at 652, the read word line RWL 614 at 654, and the read bit line RBL 610 at 656.

In a write operation, to write data into the 3T DRAM cell 600, the write word line WWL 612 is set to VDD to bias on the write transistor MW 602, and the write bit line WBL 608 is set to a write voltage −Vwrite to write the data onto the gate capacitance at the storage node SN of the storage transistor MS 604. The power supply voltage VDD 616 is set to −VDD. Also, the read word line RWL 614 is set to GND to bias off the read transistor MR 606, and the read bit line RBL 610 is at −VSS. In some embodiments, VDD is 1.2 V. In some embodiments, −Vwrite is −1.5 V for a low (logic 0) and 1.5 V for a high (logic 1). In some embodiments, −VDD is −1.2 V. In some embodiments, GND is 0 V. In some embodiments, −VSS is −0.1 V.

In a read operation, the write word line WWL 612 is set to VDD, which biases on the write transistor MW 602, such that the write bit line WBL 608 receives the voltage −Vread-G from the gate of the storage transistor MS 604. The read bit line RBL 610 is charged to VSS and the read word line RWL 614 is set to −VDD to bias on the read transistor MR 606 for reading the state of the storage transistor MS 604 at the read bit line 610. If the storage transistor MS 604 is biased on, the read bit line RBL 610 is discharged toward −VDD, and if the storage transistor MS 604 is biased off, the read bit line remains charged to VSS. The power supply voltage VDD 616 is set to −VDD. In some embodiments, VDD is 1.2 V. In some embodiments, −Vread-G is −0.3 V. In some embodiments, −VDD is −1.2 V. In some embodiments, VSS is 0.1 V.

In a hold operation, the write word line WWL 612 is set to GND to bias off the write transistor 602 and the write bit line WBL 608 is at −Vread. The read word line RWL 614 is set to VSS, which may bias off the read transistor MR 606 and the read bit line RBL 610 is at VSS. Also, the power supply voltage VDD 616 is set to −VDD. In some embodiments, GND is 0 V. In some embodiments, −Vread is −0.5 V. In some embodiments, −VDD is −1.2 V. In some embodiments, VSS is 0.1 V.

Figures 19, 20:
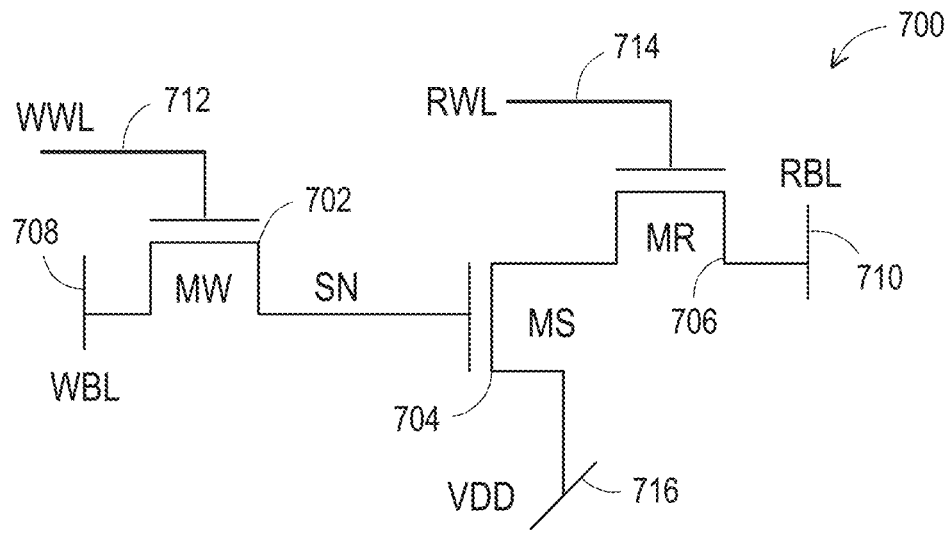
FIG. 19 is a diagram schematically illustrating a 3T DRAM cell that includes a write transistor MW that is an n-type FET, a storage transistor MS that is an n-type FET, and a read transistor MR that is an n-type FET, in accordance with some embodiments.
FIG. 20 is a diagram schematically illustrating a table that includes operating voltages for the 3T DRAM cell of FIG. 19, in accordance with some embodiments.

FIG. 19 is a diagram schematically illustrating a 3T DRAM cell 700 that includes a write transistor MW 702 that is an n-type FET, a storage transistor MS 704 that is an n-type FET, and a read transistor MR 706 that is an n-type FET, in accordance with some embodiments. The 3T DRAM cell 700 includes at least one transistor that includes a ferroelectric material, such as HZO, in the gate structure of the transistor. The 3T DRAM cell 700 is configured to be used in a memory device, such as the memory device 40 of FIG. 1. In some embodiments, the 3T DRAM cell 700 is like one of the memory cells 44.

At least one of the write transistor MW 702, the storage transistor MS 704, and the read transistor MR 706 includes a ferroelectric material, such as HZO, in the gate structure of the transistor. The ferroelectric material is processed/manufactured to provide a selectable permanent polarization, i.e., a remnant polarization, or a negative gate capacitance, depending on the crystalline phase and/or stress state of the ferroelectric material. A transistor that includes the ferroelectric material that provides the selectable permanent polarization is a FeFET that can be used to store data and increase the data retention times of the 3T DRAM cell 700. A transistor that includes the ferroelectric material that provides the negative gate capacitance characteristic is an NCFET that can be used to amplify the electric field provided by the gate voltage, lower the subthreshold swing of the transistor, and increase the switching speed of the transistor.

The 3T DRAM cell 700 is electrically connected to a write bit line WBL 708 and a read bit line RBL 710, like the write bit line WBL 46 and the read bit line RBL 48 of the memory device 40. Also, the 3T DRAM cell 700 is electrically connected to a write word line WWL 712, like the write word line WWL of the memory device 40, and a read word line RWL 714, like the read word line RWL of the memory device 40. In addition, the 3T DRAM cell 700 is electrically connected to receive a power supply voltage VDD 716.

The write transistor MW 702 has a drain/source path that extends from a first drain/source region that is electrically connected to the write bit line WBL 708 to a second drain/source region that is electrically connected to the gate structure of the storage transistor MS 704, also referred to as the storage node SN. The write word line WWL 712 is electrically connected to the gate structure of the write transistor MW 702.

The storage transistor MS 704 has a drain/source path that extends from a first drain/source region that is electrically connected to a first drain/source region of the read transistor MR 706 to a second drain/source region that is electrically connected to the power supply voltage VDD 716.

The read transistor MR 706 has a drain/source path that extends from the first drain/source region that is electrically connected to the first drain/source region of the storage transistor MS 704 to a second drain/source region that is electrically connected to the read bit line RBL 710. The read word line RWL 714 is electrically connected to the gate structure of the read transistor MR 706.

In operation, data is written to the storage node SN of the storage transistor MS 704 through the write transistor MW 702 and data is read out from the storage transistor MS 704 through the read transistor MR 706.

In some embodiments, the write transistor MW 702 is formed to be an NCFET, the storage transistor MS 704 is formed to be a FeFET, and the read transistor MR 706 is formed to be a MOSFET with an HK dielectric in the gate structure and without ferroelectric material in the gate structure. The NCFET write transistor MW 702 has a lower subthreshold swing that increases the switching speed of the write transistor MW 702 and improves the write speed of the 3T DRAM cell 700. The FeFET storage transistor MS 704 has selectable permanent polarization, such that remnant polarization in the storage transistor MS 704 increases data retention times of the storage transistor MS 704 and the 3T DRAM cell 700. In other embodiments, the read transistor MR 706 can be formed to be an NCFET, such that the NCFET read transistor 706 has a lower subthreshold swing that increases the switching speed of the read transistor MR 706 and improves the read speed of the 3T DRAM cell 700.

Also, in other embodiments, the write transistor MW 702 can be formed to be a FeFET or a MOSFET with a HK dielectric in the gate structure and without ferroelectric material in the gate structure. In other embodiments, the storage transistor MS 704 can be formed to be an NCFET or a MOSFET with a HK dielectric in the gate structure and without ferroelectric material in the gate structure. Also, in other embodiments, the read transistor MR 706 can be formed to be a FeFET transistor.

A layout that is like the layout 160 of FIG. 4 can be used to lay out the 3T DRAM cell 700, and the manufacturing steps of FIGS. 5-13 can be used to manufacture the 3T DRAM cell 700.

FIG. 20 is a diagram schematically illustrating a table 740 that includes operating voltages for the 3T DRAM cell 700 of FIG. 19, in accordance with some embodiments. The table 740 includes voltages for writing data into the 3T DRAM cell 700 at 742, reading data from the 3T DRAM cell 700 at 744, and holding or maintaining the data in the 3T DRAM cell 700 at 746. The table 740 includes voltage for the write word line WWL 712 at 748, the write bit line WBL 708 at 750, the power supply voltage VDD 716 at 752, the read word line RWL 714 at 754, and the read bit line RBL 710 at 756.

In a write operation, to write data into the 3T DRAM cell 700, the write word line WWL 712 is set to VDD to bias on the write transistor MW 702, and the write bit line WBL 708 is set to a write voltage −Vwrite to write the data onto the gate capacitance at the storage node SN of the storage transistor MS 704. The power supply voltage VDD 716 is set to GND. Also, the read word line RWL 714 is set to GND to bias off the read transistor MR 706, and the read bit line RBL 710 is set to GND. In some embodiments, VDD is −1.2 V. In some embodiments, −Vwrite is −1.5 V for a low (logic 0) and 1.5 V for a high (logic 1). In some embodiments, GND is 0 V.

In a read operation, the write word line WWL 712 is set to VDD, which biases on the write transistor MW 702, such that the write bit line WBL 708 receives the voltage −Vread-G from the gate of the storage transistor MS 704. The read bit line RBL 710 is charged to +VDD and the read word line RWL 714 is set to +VDD to bias on the read transistor MR 706 for reading the state of the storage transistor MS 704 at the read bit line 710. If the storage transistor MS 704 is biased on, the read bit line RBL 710 is discharged toward GND, and if the storage transistor MS 704 is biased off, the read bit line remains charged to +VDD. The power supply voltage VDD 716 is set to GND. In some embodiments, VDD is 1.2 V. In some embodiments, −Vread-G is −0.03 V. In some embodiments, +VDD is 1.2 V. In some embodiments, GND is 0 V.

In a hold operation, the write word line WWL 712 is set to GND to bias off the write transistor 702 and the write bit line WBL 708 is at −GND. The read word line RWL 714 is set to VSS, which may bias off the read transistor MR 706 and the read bit line RBL 710 is at GND. Also, the power supply voltage VDD 716 is set to GND. In some embodiments, GND is 0 V. In some embodiments, VSS is 0.1 V.

Figure 21:
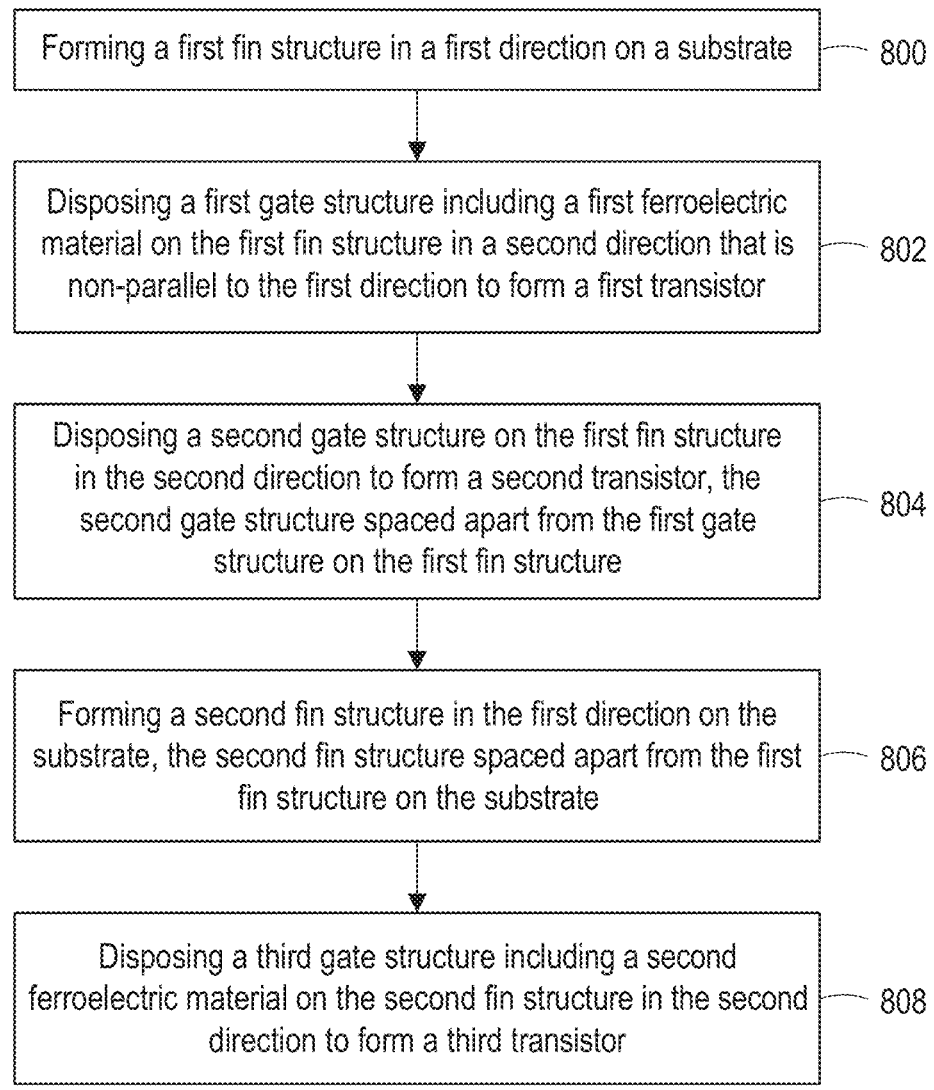
FIG. 21 is a diagram schematically illustrating a method of manufacturing a memory device, in accordance with some embodiments.

FIG. 21 is a diagram schematically illustrating a method of manufacturing a memory device, in accordance with some embodiments.

At 800, the method includes forming a first fin structure in a first direction on a substrate. In some embodiments, the method includes using a lithographic process for patterning a semiconductor substrate 300 to manufacture the fin structures as described above in relation to FIGS. 8-10.

At 802, the method includes disposing a first gate structure including a first ferroelectric material on the first fin structure in a second direction that is non-parallel to the first direction to form a first transistor and, at 804, the method includes disposing a second gate structure on the first fin structure in the second direction to form a second transistor, where the second gate structure is spaced apart from the first gate structure on the first fin structure. In some embodiments, the method includes forming the first and second gate structures in a gate-last process like the process described above in relation to FIGS. 11-13.

At 806, the method includes forming a second fin structure in the first direction on the substrate, where the second fin structure is spaced apart from the first fin structure on the substrate. In some embodiments, the method includes using the lithographic process for patterning the semiconductor substrate 300 to manufacture the fin structures as described in relation to FIGS. 8-10. In some embodiments, the step at 806 is performed at the same time as the step at 800.

At 808, the method includes disposing a third gate structure including a second ferroelectric material on the second fin structure in the second direction to form a third transistor. In some embodiments, the method includes forming the first and second gate structures in a process like the gate-last process described in relation to FIGS. 11-13. In some embodiments, the step at 808 is performed at the same time as the steps at 802 and 804.

In some embodiments, the first ferroelectric material provides ferroelectric data retention in the first transistor and, in some embodiments, the second ferroelectric material provides negative capacitance in the third transistor. In other embodiments, the first ferroelectric material provides negative capacitance in the first transistor and, in some embodiments, the second ferroelectric material provides ferroelectric data retention in the third transistor. Also, in some embodiments, disposing the second gate structure on the first fin structure includes disposing the second gate structure including the second ferroelectric material on the first fin structure, wherein the second ferroelectric material provides negative capacitance in the second transistor.

Disclosed embodiments thus provide DRAM cells that include transistors that provide increased data retention times and increased switching speeds. This results in decreased write times, decreased read times, and longer data retention times. In disclosed embodiments, one or more of the write transistor MW, the storage transistor MS, and the read transistor MR includes a ferroelectric material in the gate structure of the transistor. The ferroelectric material is manufactured to provide a selectable permanent polarization or to provide a negative gate capacitance, depending on the crystalline phase and/or stress state of the ferroelectric material. The ferroelectric material that provides the selectable permanent polarization is provided in a FeFET that can be used to store data and increase data retention times. The ferroelectric material that provides the negative gate capacitance is provided in an NCFET that can be used to amplify the electric field provided by the gate voltage to lower the subthreshold swing of the transistor and increase the switching speed of the transistor.

In disclosed embodiments, one or more of the write transistor MW and the read transistor MR is an NCFET and, in some embodiments, the storage transistor MS is a FeFET. If the write transistor MW and/or the read transistor MR is an NCFET, the subthreshold swing of the transistor is reduced, and the switching speed of the transistor is increased. As a result, the write speed and/or the read speed of the DRAM cell is increased. Also, if the storage transistor MS is a FeFET, data retention times are increased due to remnant polarization and, in some embodiments, data can be stored permanently, such that the memory becomes a non-volatile memory and data retention times are no longer an issue.

In accordance with some embodiments, a memory device includes a plurality of memory cells, where at least one of the plurality of memory cells includes a first transistor, a second transistor, and a third transistor. The first transistor includes a first drain/source path and a first gate structure electrically coupled to a write word line. The second transistor includes a second drain/source path and a second gate structure electrically coupled to the first drain/source path of the first transistor. The third transistor includes a third drain/source path electrically coupled to the second drain/source path of the second transistor and a third gate structure electrically coupled to a read word line. Where, the first transistor, and/or the second transistor, and/or the third transistor is a ferroelectric field effect transistor or a negative capacitance field effect transistor.

In accordance with further embodiments, a memory device includes a plurality of memory cells, where at least one of the plurality of memory cells includes a first negative capacitance field effect transistor, a ferroelectric field effect transistor, and a second negative capacitance field effect transistor. The first negative capacitance field effect transistor including a first drain/source path and a first gate structure that is electrically coupled to a write word line, the ferroelectric field effect transistor including a second drain/source path and a second gate structure that is electrically coupled to the first drain/source path of the first negative capacitance field effect transistor, and the second negative capacitance field effect transistor including a third drain/source path electrically coupled to the second drain/source path of the ferroelectric field effect transistor and a third gate structure electrically coupled to a read word line.

In accordance with still further disclosed aspects, a method of manufacturing a memory device includes: forming a first fin structure in a first direction on a substrate; disposing a first gate structure including a first ferroelectric material on the first fin structure in a second direction that is non-parallel to the first direction to form a first transistor; disposing a second gate structure on the first fin structure in the second direction to form a second transistor, the second gate structure spaced apart from the first gate structure on the first fin structure; forming a second fin structure in the first direction on the substrate, the second fin structure spaced apart from the first fin structure on the substrate; and disposing a third gate structure including a second ferroelectric material on the second fin structure in the second direction to form a third transistor.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of memory cells, at least one memory cell of the plurality of memory cells including three transistors that form a storage node that stores a bit of data of the at least one memory cell, the three transistors including:
a first transistor of the transistors including a first drain/source path and including a first gate structure connected to a write word line;
a second transistor of the three transistors including a second drain/source path and including a second gate structure connected to the first drain/source path of the first transistor at the storage node of the at least one memory cell; and
a third transistor of the three transistors including a third drain/source path connected to the second drain/source path of the second transistor and including a third gate structure connected to a read word line without being connected to the second gate structure or the storage node of the at least one memory cell,
wherein the first transistor, and/or the second transistor, and/or the third transistor is a ferroelectric field effect transistor or a negative capacitance field effect transistor.

2. The memory device of claim 1, wherein the first transistor is a ferroelectric field effect transistor.

3. The memory device of claim 1, wherein the second transistor is a negative capacitance field effect transistor.

4. The memory device of claim 1, wherein the third transistor is a ferroelectric field effect transistor.

5. The memory device of claim 1, wherein the first transistor is a negative capacitance field effect transistor.

6. The memory device of claim 1, wherein the second transistor is a ferroelectric field effect transistor.

7. The memory device of claim 1, wherein the third transistor is a negative capacitance field effect transistor.

8. The memory device of claim 1, wherein the first transistor is a ferroelectric field effect transistor, and the second transistor is a negative capacitance field effect transistor.

9. The memory device of claim 1, wherein the first transistor is a negative capacitance field effect transistor, and the second transistor is a ferroelectric field effect transistor.

10. The memory device of claim 1, wherein the third gate structure of the third transistor includes a high k dielectric.

11. The memory device of claim 1, wherein the ferroelectric field effect transistor and/or the negative capacitance field effect transistor includes hafnium zirconium oxide (HZO).

12. A memory device, comprising:
a plurality of memory cells, at least one memory cell of the plurality of memory cells including three transistors that form a storage node that stores a bit of data of the at least one memory cell, the three transistors including:
a first negative capacitance field effect transistor of the three transistors including a first drain/source path and including a first gate structure that is connected to a write word line;
a ferroelectric field effect transistor of the three transistors including a second drain/source path and including a second gate structure that is connected to the first drain/source path of the first negative capacitance field effect transistor at the storage node of the at least one memory cell, and
a second negative capacitance field effect transistor of the three transistors including a third drain/source path connected to the second drain/source path of the ferroelectric field effect transistor and including a third gate structure connected to a read word line without being connected to the second gate structure of the storage node at least one memory cell.

13. The memory device of claim 12, wherein the first gate structure, and/or the second gate structure, and/or the third gate structure includes hafnium zirconium oxide (HZO).

14. The memory device of claim 12, comprising a first fin structure in a first direction, wherein the second gate structure and the third gate structure are spaced apart and situated across the first fin structure in a second direction that is non-parallel with the first direction.

15. The memory device of claim 14, comprising a second fin structure in the first direction and spaced apart from the first fin structure, wherein the first gate structure is situated across the second fin structure in the second direction.

16. A memory device, comprising:
a plurality of memory cells, at least one memory cell of the plurality of memory cells including three transistors that form a storage node that stores a bit of data of the at least one memory cell, the three transistors including:
a first transistor of the three transistors including a first drain/source path connected at one end to a write bit line and including a first gate structure connected to a write word line;
a second transistor of the three transistors including a second drain/source path connected at one end to receive a power supply voltage and including a second gate structure connected to another end of the first drain/source path of the first transistor at the storage node of the at least one memory cell; and
a third transistor of the three transistors including a third drain/source path connected at one end to a read bit line and at another end to the second drain/source path of the second transistor and including a third gate structure connected to a read word line without being directly connected to the second gate structure or the storage node of the at least one memory cell,
wherein the first transistor, and/or the second transistor, and/or the third transistor is a ferroelectric field effect transistor or a negative capacitance field effect transistor.

17. The memory device of claim 16, wherein the first transistor is a ferroelectric field effect transistor.

18. The memory device of claim 16, wherein the second transistor is a negative capacitance field effect transistor.

19. The memory device of claim 16, wherein the third transistor is a ferroelectric field effect transistor.

20. The memory device of claim 16, wherein the first transistor is a negative capacitance field effect transistor, and the second transistor is a ferroelectric field effect transistor.

* * * * *